US008878231B2

(12) United States Patent
Yi et al.

(10) Patent No.: US 8,878,231 B2
(45) Date of Patent: Nov. 4, 2014

(54) LIGHT EMISSION DEVICE AND MANUFACTURING METHOD THEREOF

(75) Inventors: Gyu-Chul Yi, Seoul (KR); Chul-Ho Lee, Seoul (KR)

(73) Assignee: SNU R&DB Foundation, Seoul (KR)

( * ) Notice: Subject to any disclaimer, the term of this patent is extended or adjusted under 35 U.S.C. 154(b) by 172 days.

(21) Appl. No.: 13/321,572

(22) PCT Filed: May 18, 2010

(86) PCT No.: PCT/KR2010/003143
§ 371 (c)(1),
(2), (4) Date: Nov. 21, 2011

(87) PCT Pub. No.: WO2010/134747
PCT Pub. Date: Nov. 25, 2010

(65) Prior Publication Data
US 2012/0061646 A1    Mar. 15, 2012

(30) Foreign Application Priority Data

May 22, 2009    (KR) .................. 10-2009-0045165

(51) Int. Cl.
*H01L 33/00* (2010.01)
*H01L 33/24* (2010.01)
*H01L 33/38* (2010.01)
*H01L 33/44* (2010.01)

(52) U.S. Cl.
CPC ............ *H01L 33/24* (2013.01); *H01L 33/38* (2013.01); *H01L 33/44* (2013.01)
USPC .................... 257/103; 257/E33.006

(58) Field of Classification Search
USPC .................................. 257/79–103
See application file for complete search history.

(56) References Cited

U.S. PATENT DOCUMENTS

| 7,906,354 B1* | 3/2011 | Ellinger et al. ............... 438/26 |
| 2008/0036038 A1* | 2/2008 | Hersee et al. ................ 257/615 |
| 2010/0019252 A1* | 1/2010 | Bratkovski et al. ............ 257/80 |
| 2010/0102380 A1* | 4/2010 | Ohlsson et al. .............. 257/329 |
| 2010/0283064 A1* | 11/2010 | Samuelson et al. ............ 257/88 |
| 2010/0327258 A1* | 12/2010 | Lee et al. ..................... 257/14 |
| 2012/0235117 A1* | 9/2012 | Fukui et al. .................. 257/13 |
| 2013/0015426 A1* | 1/2013 | Waag et al. ................... 257/13 |

FOREIGN PATENT DOCUMENTS

| KR | 10-2006-0124833 | 12/2006 |
| KR | 10-0809248 | 2/2008 |
| KR | 10-2009-0003840 | 1/2009 |

OTHER PUBLICATIONS

WO 2008/034823; Ohlsson et al.*

* cited by examiner

*Primary Examiner* — Benjamin Sandvik
(74) *Attorney, Agent, or Firm* — Lexyoume IP Meister, PLLC

(57) ABSTRACT

The present invention provides a light emission device and a manufacturing method thereof. The light emission device includes: i) a substrate; ii) a mask layer disposed on the substrate and having at least one opening; iii) a light emission structure formed on the mask layer surrounding the opening and extended substantially perpendicular to a surface of the substrate; iv) a first electrode formed on the mask layer while surface-contacting the external surface of the light emission structure; and v) a second electrode disposed in the light emission structure and surface-contacting the internal surface of the light emission structure.

18 Claims, 24 Drawing Sheets

LIGHT EMISSION DEVICE AND MANUFACTURING METHOD THEREOF

CROSS-REFERENCE TO RELATED APPLICATION

This application claims priority to and the benefit of Korean Patent Application No. 10-2009-0045165 filed in the Korean Intellectual Property Office on May 22, 2009, the entire contents of which are incorporated herein by reference.

BACKGROUND OF THE INVENTION (a) Field of the Invention

The present invention relates to a light emission device. More particularly, the present invention relates to a high-efficiency light emission device using a nano structure perpendicularly formed to a substrate, and a manufacturing method thereof.

(b) Description of the Related Art

A manufacturing method of a nano structure using a bottom-up method has been highlighted. A nano structure manufactured by using the bottom-up method is grown to excellent crystalline having very low potential density even though it is different from a substrate in a material coefficient (such as a lattice constant, a thermal expansion coefficient, etc.). Thus, the nano structure has more excellent crystallity than a nano structure manufactured using a top-down method based on a thin film deposition and etching process so that the nano structure manufactured using the bottom-top method has excellent electric and optical properties.

Recently, a light emission device using such a feature of the nano structure has been actively developed. A light emission device using the nano structure acquires light from the nano structure by arranging electrodes at both ends of the nano structure and applied voltages to the electrodes. Light extraction efficiency of the light emission device greatly depends on the contact area of the electrodes and the nano structure.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a light emission device that can increase efficiency and an output by enlarging the contact area between an electrode and a nano structure and a light emission area of the nano structure.

Further, the present invention provides a manufacturing method of the light emission device.

A light emission device according to an exemplary embodiment of the present invention includes: i) a substrate; ii) a mask layer disposed on the substrate and having at least one opening; iii) a light emission structure formed on the mask layer surrounding the opening and extended substantially perpendicular to a surface of the substrate; iv) a first electrode formed on the mask layer while surface-contacting the external surface of the light emission structure; and v) a second electrode disposed in the light emission structure and surface-contacting the internal surface of the light emission structure.

The light emission structure may include an n-type semiconductor layer and a p-type semiconductor layer contacting the n-type semiconductor. The light emission structure may further include a quantum active layer disposed between the n-type semiconductor layer and the p-type semiconductor layer, and the quantum active layer may include a plurality of quantum barrier layers and a plurality of quantum well layers layered between the plurality of quantum barrier layers.

The n-type semiconductor may include gallium nitride, aluminum nitride, gallium aluminum nitride, or indium gallium nitride doped with at least one n-type impurity selected from silicon, germanium, selenium, tellurium, and carbon, and the p-type semiconductor may include gallium nitride, aluminum nitride, nitride gallium aluminum, or nitride indium gallium doped with at least one p-type impurity selected from magnesium, zinc, and beryllium.

The n-type semiconductor layer may include zinc oxide, zinc magnesium oxide, zinc magnesium oxide cadmium, zinc oxide beryllium, zinc magnesium oxide beryllium, zinc magnesium oxide, or zinc magnesium manganese oxide doped with at least one n-type impurity selected from aluminum, gallium, indium, fluorine, chlorine, and hydrogen, and the p-type semiconductor layer may include zinc oxide, zinc magnesium oxide, zinc magnesium oxide cadmium, zinc oxide beryllium, zinc magnesium oxide beryllium, zinc magnesium oxide, or zinc magnesium manganese oxide doped with at least one p-type impurity selected from lithium, sodium, potassium, nitrogen, phosphorus, arsenic, and stibium.

The n-type semiconductor layer may include an n-type conductive polymer and the p-type semiconductor layer comprises a p-type conductive polymer. The quantum battier layer may include at least one element selected from a group consisting of gallium nitride, aluminum nitride, nitride gallium aluminum, zinc oxide, magnesium zinc oxide, zinc oxide beryllium, zinc magnesium oxide beryllium, zinc manganese oxide, and zinc magnesium manganese oxide, and the quantum well layer may include at least one element selected from a group consisting of gallium nitride, nitride indium gallium, indium gallium aluminum, zinc oxide, and cadmium zinc oxide.

The light emission device may further include an insulation layer covering the light emission structure and the upper surface of the first electrode while surrounding the external surface of the first electrode, and a part of the second electrode may be extended over the insulation layer. The second electrode may wholly fill the inside of the light emission structure.

The substrate may include at least one selected from a group consisting carbon, silicon, aluminum oxide, gallium arsenide, spinel, indium phosphide, gallium phosphide, aluminum phosphide, gallium nitride, indium nitride, aluminum nitride, zinc oxide, magnesium oxide, silicon carbide, titanium oxide, single crystal sapphire, quartz, and pyrex.

The light emission device according to the exemplary embodiment of the present invention may further include seed layers disposed between the substrate and the mask layer and between the substrate and the opening. The seed layer may include at least one element selected from a group consisting carbon, silicon, aluminum oxide, gallium arsenide, spinel, indium phosphide, gallium phosphide, aluminum phosphide, gallium nitride, indium nitride, aluminum nitride, zinc oxide, magnesium oxide, silicon carbide, and titanium oxide.

A light emission device according to another exemplary embodiment of the present invention includes: i) a substrate; ii) a mask layer disposed on the substrate and having at least one opening; iii) a nano structure formed on the substrate while penetrating the opening and having a wall portion extended substantially perpendicular to a surface of the substrate; iv) a light emission structure extended in a direction along the same direction in which the wall portion is extended while contacting the external surface of the wall portion; v) a first electrode formed on the mask layer while surface-contacting the external surface of the light emission structure; and vi) a second electrode provided on the substrate so as to surface-contact the nano structure.

The second electrode may be disposed in the wall portion and thus surface-contacts the internal surface of the wall portion. The second electrode may fill the inside of the wall portion. The light emission device according to the other exemplary embodiment of the present invention may further include an insulation layer covering the external surface of the first electrode, the upper surface of the light emission structure, and the upper surface of the first electrode, and a part of the second electrode may be extended over the insulation layer.

The light emission device according to the other exemplary embodiment of the present invention may further include seed layers disposed between the substrate and the mask layer and between the substrate and the opening. The seed layer may include at least one selected from a group consisting carbon, silicon, aluminum oxide, gallium arsenide, spinel, indium phosphide, gallium phosphide, aluminum phosphide, gallium nitride, indium nitride, aluminum nitride, zinc oxide, magnesium oxide, silicon carbide, and titanium oxide.

The nano structure may further include a bottom portion contacting the wall portion, and the second electrode may surface-contact the bottom portion by being disposed between the substrate and the mask layer and between the substrate and the bottom portion. The second electrode may be formed of a conductive seed layer. The second electrode may further include a metal layer disposed between the conductive seed layer and the mask layer. The light emission structure may include: i) a first light emission portion extended along the same direction along which the wall portion is extended while contacting the internal and external surfaces of the wall portion; ii) a second light emission portion contacting the upper surface of the wall portion; and iii) a third light emission portion contacting the upper surface of the bottom portion. The light emission device may further include an insulation layer formed between the mask layer and the first electrode and the upper surface of the third light emission portion, and the thickness of the insulation layer is smaller than the height of the wall portion. The first electrode may be formed on the insulation layer while contacting the external surface of the first light emission portion and the external surface of the second light emission portion.

The light emission device according to the other exemplary embodiment of the present invention may further include a conductive layer covering the first electrode while filling the inside of the first light emission portion. The nano structure may include at least one element selected from a group consisting zinc oxide, zinc magnesium oxide, zinc magnesium oxide cadmium, zinc oxide beryllium, zinc magnesium oxide beryllium, zinc magnesium oxide, zinc magnesium manganese oxide, gallium nitride, aluminum nitride, gallium aluminum nitride, and indium gallium nitride.

A manufacturing method of a light emission device according to another exemplary embodiment of the present invention includes: i) providing a substrate; ii) forming a mask layer having at least one opening on the substrate; iii) growing a nano structure on the substrate by penetrating the opening along an edge of the opening; iv) forming a light emission structure by sequentially growing an n-type semiconductor layer, a quantum active layer, and a p-type semiconductor layer in the external surface of the nano structure; v) forming a first electrode on the external surface of the light emission structure and on the mask layer; and vi) forming a second electrode in the nano structure so as to contact the internal surface of the nano structure.

The manufacturing method according to the other exemplary embodiment of the present invention may include eliminating the nano structure after forming the light emission structure, and, in the forming of the second electrode, the second electrode may be formed in the light emission structure so as to contact the internal surface of the light emission structure.

A manufacturing method of a light emission device according to another exemplary embodiment of the present invention includes: i) providing a substrate; ii) forming a second electrode with a conductive seed material on the substrate; iii) forming a mask layer having at least one opening on the second electrode; iv) growing a nano structure including a bottom portion and a wall portion on the substrate while penetrating the opening; v) forming a light emission structure by sequentially growing an n-type semiconductor layer, a quantum active layer, and a p-type semiconductor layer in the internal and external surfaces of the wall portion and the upper surface of the bottom portion; and vi) forming a first electrode on the light emission structure so as to contact the external surface of the light emission structure. The manufacturing method according to the other exemplary embodiment of the present invention may further include forming a conductive layer covering the first electrode after the forming of the first electrode.

According to the present invention, a light emission device of which a light emission area of a light emission structure can be provided. In addition, the present invention can provide a light emission device that can minimize contact resistance between the first electrode and the light emission structure and contact resistance between the second electrode and the light emission structure. Accordingly, the light emission efficiency and output efficiency of the light emission device can be improved and performance deterioration can be minimized. An applied product such as a light emission diode and a laser can be easily manufactured using the light emission device.

DETAILED DESCRIPTION OF THE EMBODIMENTS

Figure 1:
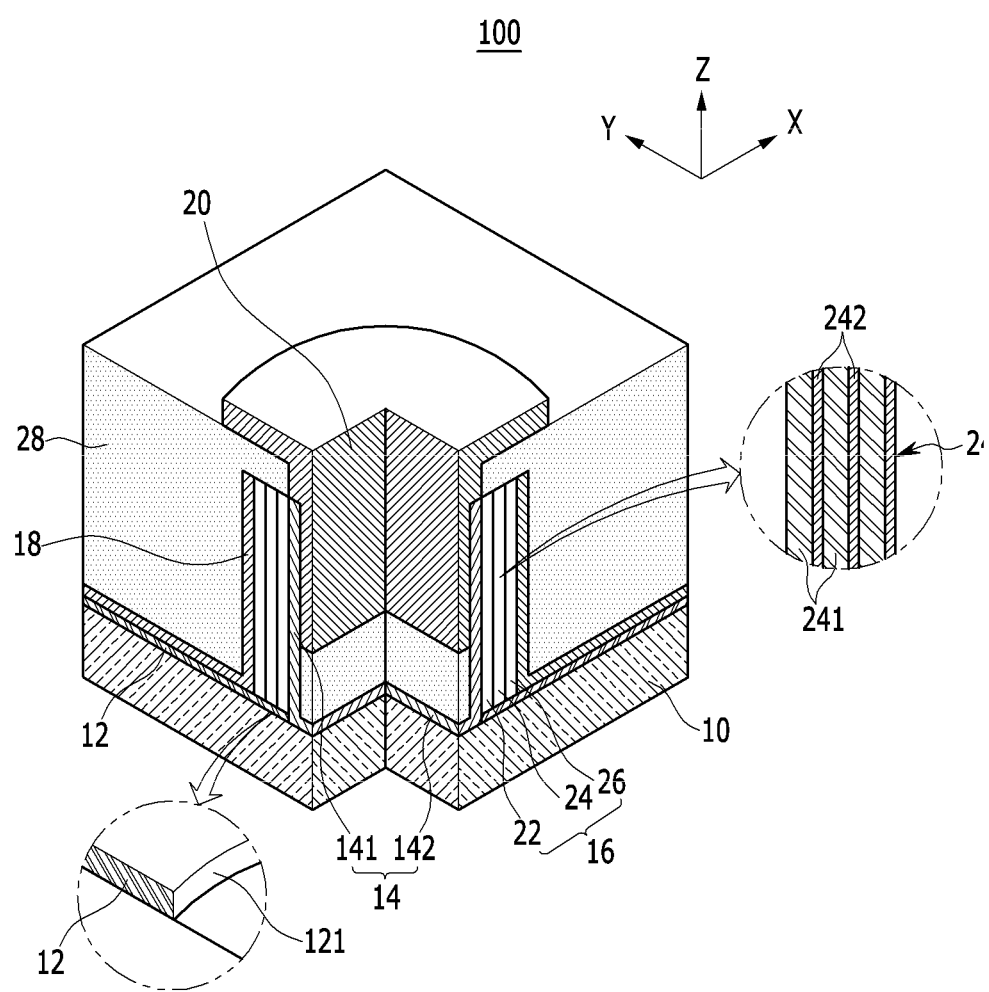
FIG. 1 is a partially cut-away perspective view of a light emission device according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

It will be understood that when an element is referred to as being "on" another element, it can be directly on another element or intervening elements may be present therebetween. On the contrary, when an element is referred to as being "directly on" another element, there are no intervening elements present.

It will be understood that, although the terms first, second, third, etc. may be used herein to describe various elements, components, regions, layers, and/or sections, they are not limited thereto. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

Terminologies used herein are provided to merely mention specific exemplary embodiments and are not intended to limit the present invention. Singular expressions used herein include plurals unless they have definitely opposite meanings. The meaning of "including" used in this specification gives shape to specific characteristics, regions, positive numbers, steps, operations, elements, and/or components, and do not exclude the existence or addition of other specific characteristics, regions, positive numbers, steps, operations, elements, components, and/or groups.

Spatially relative terms, such as "below" and "above" and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the drawings. For example, if the device in the figures is turned over, elements described as "below" other elements or features would then be oriented "above" the other elements or features. Thus, the exemplary term "below" can encompass both an orientation of above and below. Apparatuses may be otherwise rotated 90 degrees or at other angles, and the spatially relative descriptors used herein are then interpreted accordingly.

All the terminologies including technical terms and scientific terms used herein have the same meanings that those skilled in the art generally understand. Terms defined in dictionaries are construed to have meanings corresponding to related technical documents and the present description, and they are not construed as ideal or very official meanings, if not defined.

Exemplary embodiments of the present invention described with reference to perspective views and cross-sectional views represent ideal exemplary embodiments of the present invention in detail. Therefore, various modification of diagrams, for example, modifications of manufacturing methods and/or specifications, are expected. Accordingly, exemplary embodiments are not limited to specific shapes of shown regions, and for example, also include modifications of the shape by manufacturing. For example, regions shown or described as flat may generally have rough or rough and nonlinear characteristics. Further, portions shown to have sharp angles may be rounded. Therefore, the regions shown in the drawings are basically just schematic and the shapes thereof are not intended to show the exact shapes of the region and are also not intended to reduce the scope of the present invention.

In the specification, the term "nano" implies a nano scale. Further, the term "tube" implies a structure with a hollow center.

Hereinafter, exemplary embodiments of the present invention will be described with reference to FIG. 1 to FIG. 24. This embodiment is provided to exemplify the present invention, which is not limited to any particular embodiment.

FIG. 1 is a partially cut-away perspective view of a light emission device 100 according to a first exemplary embodiment of the present invention. The light emission device 100 is substantially nano-sized and thus it is enlarged in FIG. 1.

Referring to FIG. 1, the light emission device 100 includes a substrate 10, a mask layer 12, a nano structure 14, a light emission structure 16, a first electrode 18, and a second electrode 20. As a material of the substrate 10, carbon, silicon, aluminum oxide, gallium arsenide, spinel, indium phosphide, gallium phosphide, aluminum phosphide, gallium nitride, indium nitride, aluminum nitride, zinc oxide, magnesium oxide, silicon carbide, titanium oxide, single crystal sapphire, quartz, or pyrex. When the substrate 10 is formed of single crystal silicon, quartz, or pyrex, a large-scaled substrate 10 can be used so that manufacturing cost of the light emission device 100 can be decreased.

The mask layer 12 is disposed on the substrate 10. An opening 121 is formed in the mask layer 12 using etching and the like. The mask layer 12 may be formed of amorphous silicon oxide or silicon nitride. In this case, when the substrate 10 is formed of single crystal sapphire, quartz, or pyrex, seed layers (not shown) may be provided between the substrate 10 and the mask layer 12 and between the substrate 10 and the opening 121. The seed layer may include at least one element of carbon, silicon, aluminum oxide, gallium arsenide, spinel, indium phosphide, gallium phosphide, aluminum phosphide, gallium nitride, indium nitride, aluminum nitride, zinc oxide, magnesium oxide, silicon carbide, and titanium oxide.

The nano structure 14 formed on the substrate 10 penetrates the opening 121. The nano structure 14 is formed along an edge of the opening 121, and includes a tube-shaped wall portion 141 extended substantially perpendicular to the surface of the substrate 10, that is, the z-axis direction in the direction. The wall portion 141 grows along an interface between the substrate 10 and the opening 121. During the growth, a thin layer may be formed on the substrate 10. Thus, the nano structure 14 may include a bottom portion 142 surrounded by the wall portion 141 while being formed on the substrate 10. A diameter and the shape of the nano structure 14 are determined according to the shape of the opening 12.

The nano structure 14 may be formed of zinc oxide, zinc magnesium oxide, zinc magnesium oxide cadmium, zinc oxide beryllium, zinc magnesium oxide beryllium, zinc manganese oxide, zinc magnesium manganese oxide, gallium nitride, aluminum nitride, nitride gallium aluminum, or indium nitride gallium.

When the substrate 10 is formed of gallium nitride, the nano structure 14 may be formed of zinc oxide. Alternatively, the substrate 10 and the nano structure 14 both may be formed of zinc oxide or gallium nitride. When the nano structure 14 can be epitaxially grown on the substrate 10, the seed layer may not be additionally formed on the substrate 10. The nano structure 14 may be deposited on the substrate 10 using a metal organic chemical vapor deposition (MOCVD) method.

The light emission structure 16 contacts the external surface of the wall portion 141 and extends along the same direction of the wall portion 141. The light emission structure 16 has a multi-layered thin film structure. The light emission structure 16 includes an n-type semiconductor layer 22 and a p-type semiconductor layer 26 contacting the n-type semiconductor layer 22. A quantum active layer 24 may be provided between the n-type semiconductor layer 22 and the p-type semiconductor layer 26 to further increase light emission efficiency. The quantum active layer 24 is formed by alternately layering a plurality of quantum barrier layers 241 and a plurality of quantum well layers 242.

The n-type semiconductor layer 22 is formed of a semiconductor material doped with an n-type impurity. The p-type semiconductor layer 26 is formed of a semiconductor material doped with a p-type impurity.

The n-type impurity may include silicon, germanium, selenium, tellurium, or carbon, and the p-type impurity may include magnesium, zinc, or beryllium. The semiconductor material may include gallium nitride, aluminum nitride, gallium aluminum nitride, or indium gallium nitride.

Alternatively, the n-type impurity may include aluminum, gallium, indium, fluorine, chlorine, or hydrogen, and the p-type impurity may include lithium, sodium, potassium, nitrogen, phosphorus, arsenic, or stibium. The semiconductor material may include zinc oxide, zinc magnesium oxide, zinc magnesium oxide cadmium, zinc oxide beryllium, zinc magnesium oxide beryllium, zinc magnesium oxide, or zinc magnesium manganese oxide.

Alternatively, the n-type semiconductor layer 22 may include an n-type conductive polymer and the p-type semiconductor layer 26 may include a p-type conductive polymer.

The quantum active layer 24 emits light from recombination of electrons and holes from a layering structure of the quantum barrier layer 241 and the quantum well layer 242. The quantum barrier layer 241 may be formed of gallium nitride, aluminum nitride, nitride gallium aluminum, zinc oxide, magnesium zinc oxide, zinc oxide beryllium, zinc magnesium oxide beryllium, zinc manganese oxide, or zinc magnesium manganese oxide. The quantum well layer 242 may be formed of gallium nitride, nitride indium gallium, indium gallium aluminum, zinc oxide, or cadmium zinc oxide. The quantum active layer 24 may include three layers of quantum barrier layer 241 and three layers of quantum well layer 242. The quantum active layer 24 may emit green light, blue light, and ultraviolet rays from applied current.

The n-type semiconductor layer 22 epitaxially grows above the nano structure 14. The quantum barrier layer 241 and the quantum well layer 242 alternately grow above the n-type semiconductor layer 22 such that the quantum active layer 24 is formed. The p-type semiconductor layer 26 epitaxially grows above the quantum active layer 24. The n-type semiconductor layer 22 and the p-type semiconductor layer 26 may be deposited using the MOCVD with nitride.

Like the nano structure 14, the light emission structure 16 is formed in the shape of a tube extended along the z-axis direction. Thus, the light emission structure 16 has a large-scaled light emission area, thereby enhancing light emission efficiency.

The first electrode 18 formed on the mask layer 12 while surface-contacting with the external surface of the light emission structure 16. The first electrode 18 is formed of metal having excellent electric conductivity, and for example, may be formed by layering titanium and gold. Like the light emission structure 16, the first electrode 18 is formed in the shape of a tube extended along the z-axis direction, and thus a contact area with the light emission structure 16 is increased, thereby minimizing contact-resistance with the light emission structure 16.

The second electrode 20 is disposed in the wall portion 141, and surface-contacts the inner surface of the wall portion 141. The second electrode 20 may be formed of metal, transparent conductor, conductive polymer, and a mixture thereof. In case of metal, the second electrode 20 may be formed by layering nickel and gold. Since the second electrode 20 is formed in the shape of a circular cylinder extended in the z-axis direction, a contact area with the nano structure 14 can be increased so that contact-resistance with the nano structure 14 can be minimized. Particularly, the second electrode 20 is formed filling the inside of the wall portion 141 so that electric conductivity and thermal conductivity of the second electrode 20 can be maximized.

The first electrode 18 and the second electrode 20 should be electrically insulated from each other. For this, an insulation layer 28 may be formed to cover the upper surfaces of the light emission structure 16 and the first electrode 18 while surrounding the external surface of the first electrode 18. In this case, the insulation layer 28 may remain on the bottom portion 142 of the nano structure 14 with a constant thickness. The insulation layer 28 may be formed of a dielectric material including at least one of silicon oxide, silicon nitride, magnesium oxide, aluminum nitride, or an organic material including at least one of carbon, hydrogen, and oxygen. A part of the second electrode 20 may be extended over the insulation layer 28 and thus form a wire structure.

In the above-stated light emission device 100, light is emitted from the light emission structure 16 when the first electrode 18 and the second electrode 20 are connected with power and applied with a voltage. During this process, electrons have excellent transfer efficiency because they are transferred through the nano structure 14 extended along the z-axis direction. In addition, the light emission structure 16 has a large surface area so that light emission efficiency thereof can be increased. Further, since the first electrode 18 surface-contacts the light emission structure 16, contact-resistance is significantly decreased, and contact-resistance between the second electrode 20 and the nano structure 14 is also significantly decreased because of the surface-contact therebetween. Accordingly, light emission efficiency and output efficiency of the light emission device 100 can be remarkably increased.

An applied product such as a light emitting diode (LED) and a laser may be manufactured by arranging the light emission device 100 in plural.

Figure 2:
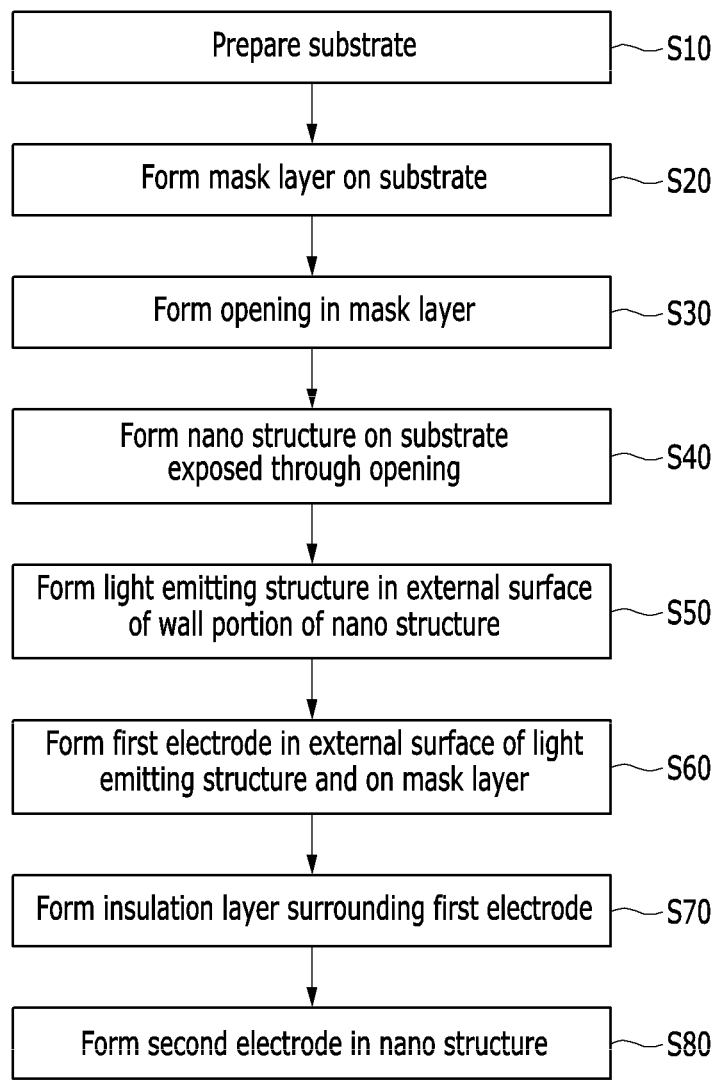
FIG. 2 is a schematic flowchart of a manufacturing method of the light emission device of FIG. 1.

FIG. 2 is a schematic flowchart of a manufacturing method of the light emission device of FIG. 1. FIG. 3 to FIG. 11 are schematic cross-sectional views of the manufacturing method of FIG. 2 on a step basis. Hereinafter, each step of FIG. 2 will be described with reference to FIG. 3 to FIG. 11.

Figure 3:
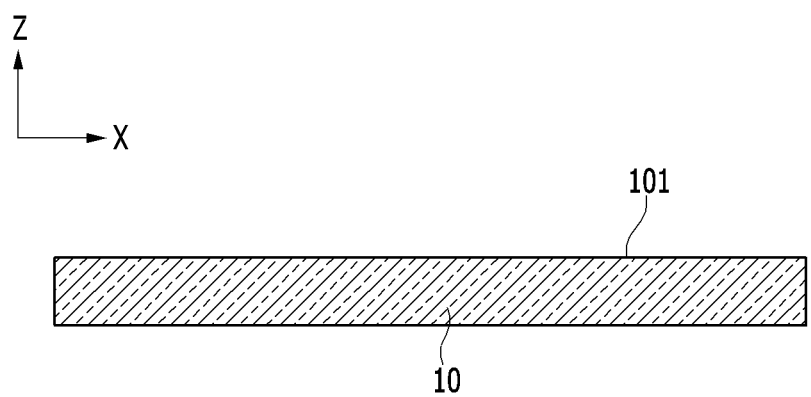
FIG. 3 to FIG. 11 are schematic cross-sectional views of the manufacturing method of FIG. 2 on a step basis.

In the step S10 of FIG. 2, the substrate 10 is prepared. A seed layer may be formed in the substrate 10. Referring to FIG. 3, a surface 101 of the substrate 10 is substantially perpendicular to the z-axis direction.

Figure 4:
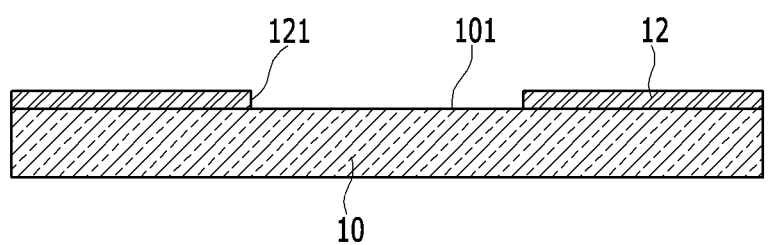

In the step S20 of FIG. 2, the mask layer 12 is formed on the substrate 10. In the step S30 of FIG. 2, the opening 121 is formed in the mask layer 12. Referring to FIG. 4, the mask layer 12 may be formed on the surface 101 of the substrate 10 using a plasma chemical vapor deposition (CVD) method. The mask layer 12 may be formed of amorphous silicon oxide or silicon nitride. The opening 121 of the mask layer 12 may be formed through etching using a photoresist. Thus, the substrate 10 is exposed to the outside through the opening 121 of the mask layer 12.

Figure 5:
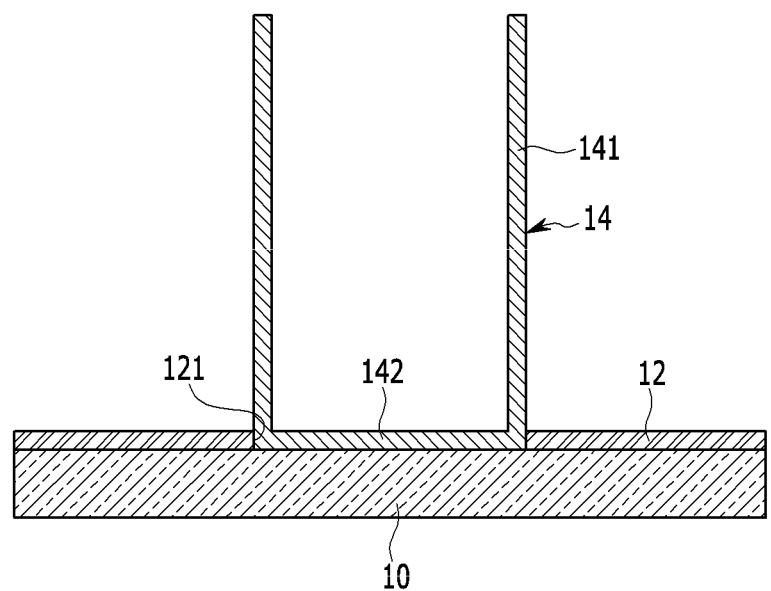

In the step S40 of FIG. 2, the nano structure 14 is formed on the substrate 10 exposed through the opening 121. Referring to FIG. 5, the nano structure 14 may be formed using a non-catalytic MOCVD. The substrate 10 may be formed of aluminum oxide and the nano structure 14 may be formed of zinc oxide. The nano structure 14 grows only on the substrate 10 exposed through the opening 121 due to the mask layer 12. The nano structure 14 may include the bottom portion 142 and the wall portion 141. The wall portion 141 may have a diameter of about 500±50 nm and a length of about 6.0±0.2 µm. A growth rate of the wall portion 141 may be 2.0±0.1 µm/hr.

Figure 6:
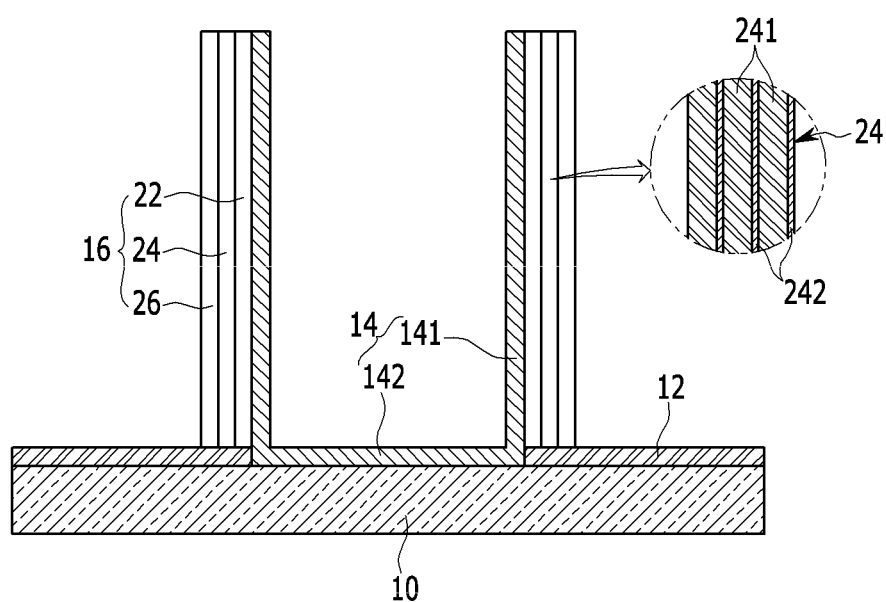

In the step S50 of FIG. 2, the light emission structure 16 is formed in the external surface of the wall portion 141 of the nano structure 14. Referring to FIG. 6, the quantum active layer 24 is formed by epitaxially growing the n-type semiconductor layer 22 in the external surface of the wall portion 141 and alternately growing the quantum barrier layer 241 and the quantum well layer 242 in the external surface of the n-type semiconductor layer 22. Subsequently, the p-type semiconductor layer 26 is grown in the external surface of the quantum active layer 24.

When the diameter of the wall portion 141 is too small, the light emission structure 16 does not grow in the inner surface of the wall portion 141. Meanwhile, when the light emission structure 16 is also grown in the inner surface of the wall portion 141, an etching mask (not shown) is wholly formed on the upper portion of the substrate 10, the inside of the wall portion 141 is exposed by patterning the etching mask, and then the light emission structure formed in the inner surface of the wall portion 141 can be selectively eliminated.

The n-type semiconductor layer 22 may be formed of gallium nitride doped with silicon and the p-type semiconductor layer 26 may be formed of gallium nitride doped with magnesium. The quantum barrier layer 241 may be formed of gallium nitride and the quantum well layer 242 may be formed of nitride indium gallium. Growth temperatures of the quantum barrier layer 241 and the quantum well layer 242 may be respectively 720° C. and 820° C. The quantum barrier layer 241 and the quantum well layer 242 may respectively have a thickness of 13 nm and a thickness of 3 nm. Like the nano structure 14, the light emission structure 16 is formed in the shape of a tube extended along the z-axis direction.

Figure 7:
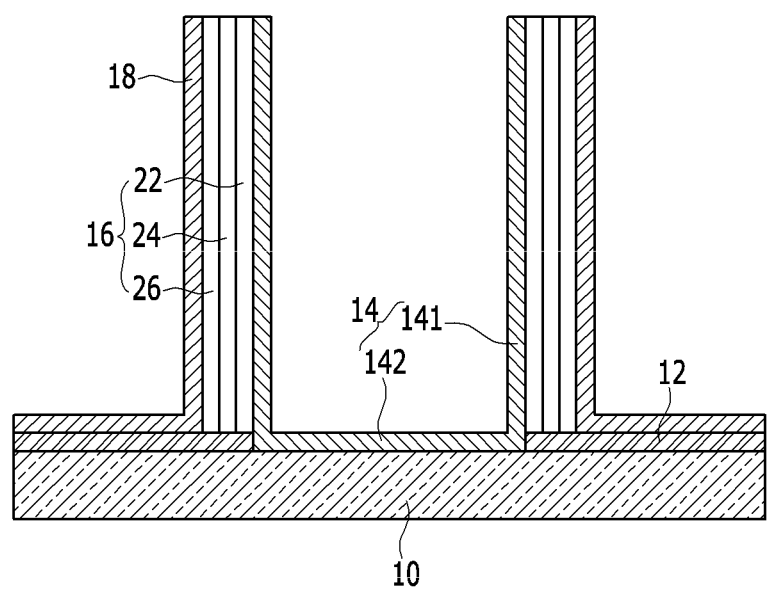

In the step S60 of FIG. 2, the first electrode 18 is formed on the external surface of the light emission structure 16 and the mask layer 12. Referring to FIG. 7, a first electrode material is uniformly deposited to the entire upper surface of the substrate 10 and then a patterning process may be performed on the external surface of the light emission structure 16 and the mask layer 12 using a photolithography to leave the first electrode 18. The first electrode 18 may be formed by layering titanium and gold.

Figure 8:
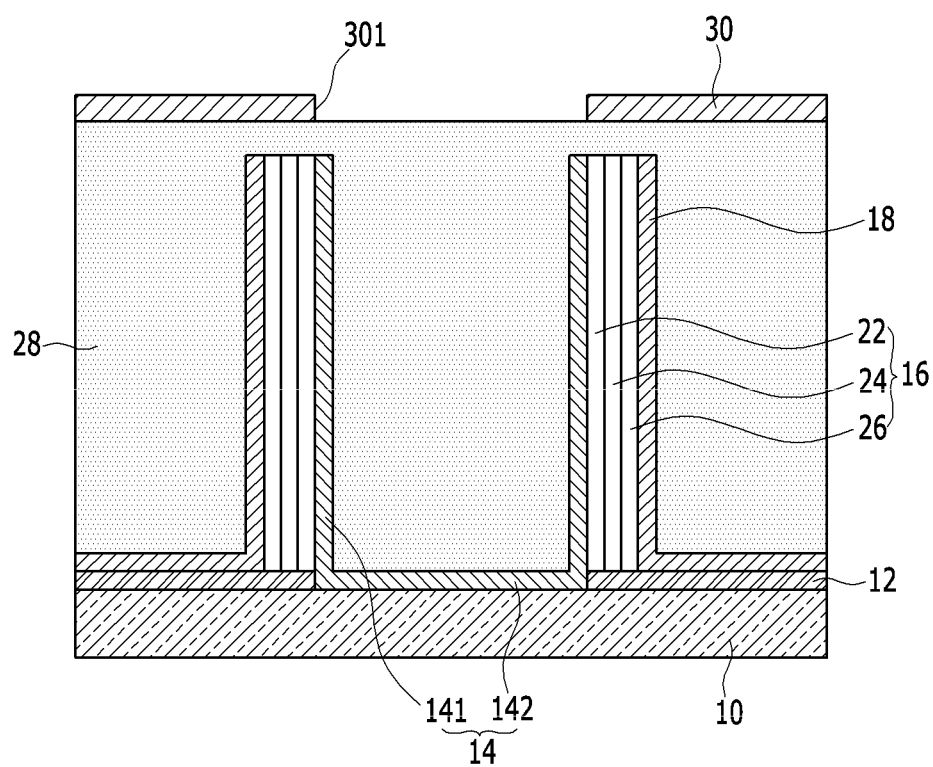
Figure 9:
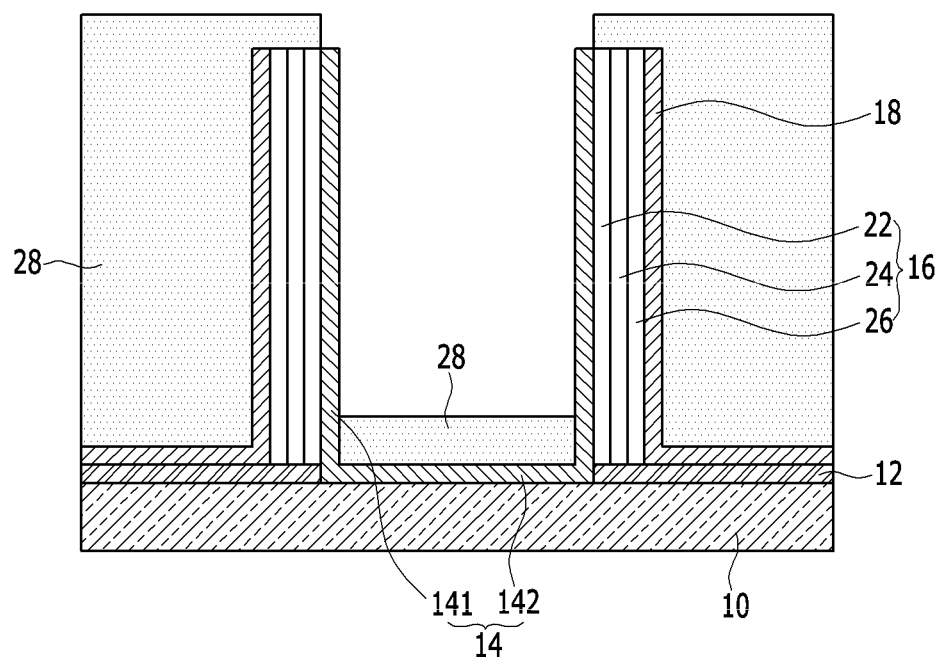

In the step S70 of FIG. 2, the insulation layer 28 surrounding the first electrode 18 is formed. Referring to FIG. 8 and FIG. 9, the insulation layer 28 is formed by spin-coating an insulation material, curing the coated insulation material, and flattening the same. In this case, the insulation layer 28 is formed larger than the nano structure 14 and the light emission structure 16 in height. Then, an opening 301 is formed by forming a pattern mask layer 30 on the insulation layer 28 and patterning the pattern mask layer 30.

Then, a portion of the insulation layer 28, exposed through the opening 301 is eliminated by performing dry-etching or wet-etching on the insulation layer 28 using an etching gas or etchant having a selective etching characteristic and then the pattern mask layer 30 is eliminated. Such that the insulation layer 28 that covers the upper surface of the first electrode 18 and the upper surface of the light emission structure 16 while surrounding the external surface of the first electrode 18 is formed. In this case, the insulation layer 28 may remain on the bottom portion 142 of the nano structure 14 with a constant thickness.

Figure 10:
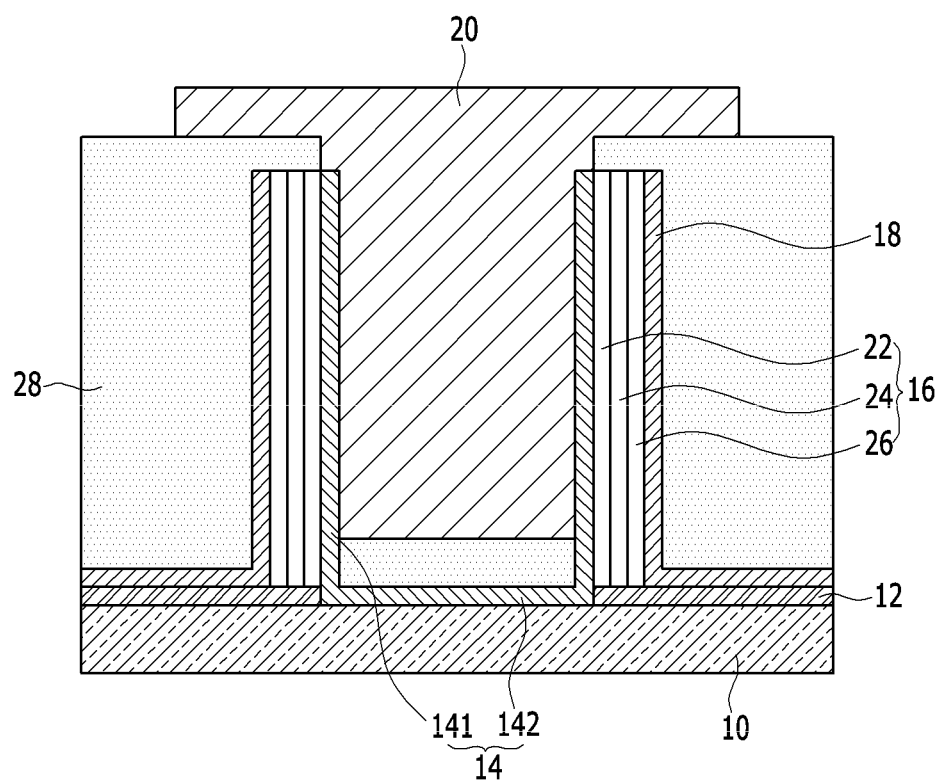

In the step S80 of FIG. 2, the second electrode 20 is formed in the nano structure 14. Referring to FIG. 10, the second electrode 20 is formed by depositing one of metal, a transparent conductor, conductive polymer, and a mixture thereof in the wall portion 141 of the nano structure 14. The second electrode 20 may have a constant thickness along the inner surface of the wall portion 141 or may be formed to fill the inside of the wall portion 141. If the second electrode 20 fills the inside of the wall portion 141, electric conductivity and thermal conductivity of the second electrode 20 can be maximized. A part of the second electrode 20 may be extended on the insulation layer 28 and form a wiring structure.

Figure 11:
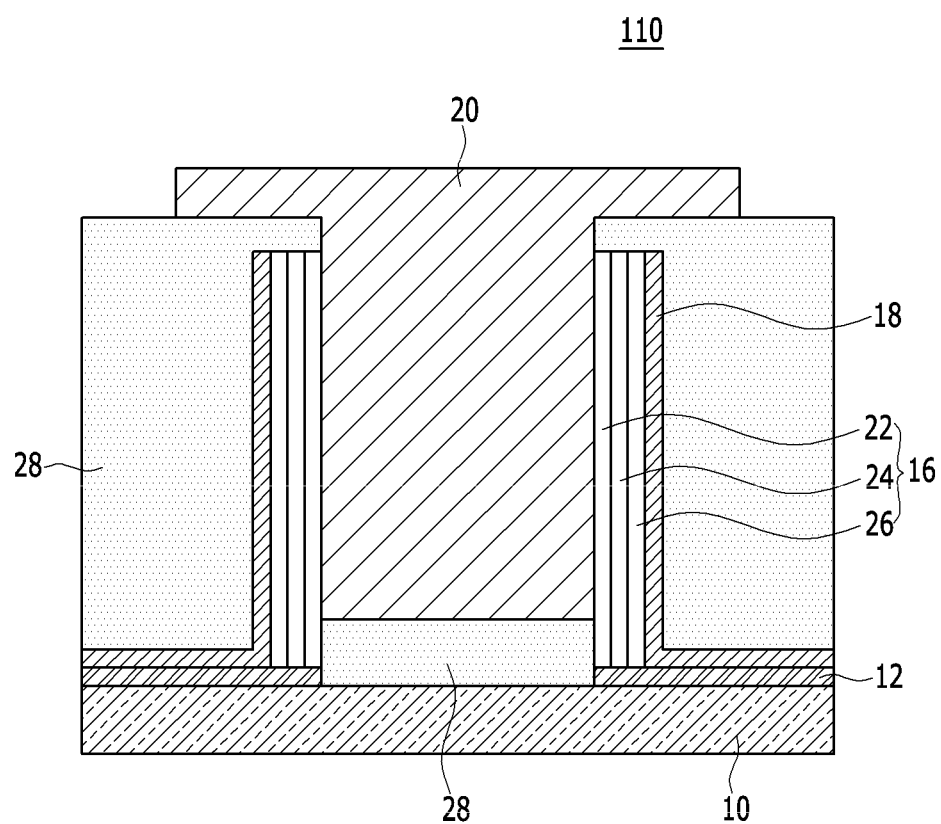

FIG. 11 is a schematic cross-sectional view of a light emission device 110 according to a second exemplary embodiment of the present invention. A structure of the light emission device 110 of FIG. 11 is similar to that of the light emission device shown in FIG. 1, and therefore like reference numerals designate like elements and a detailed description thereof will be omitted.

Referring to FIG. 11, the light emission device 110 includes a substrate 10, a mask layer 12, a light emission structure 16, a first electrode 18, and a second electrode 20.

Compared to the light emission device 100 of the first exemplary embodiment, the nano structure 14 (shown in FIG. 1) is omitted and a second electrode 20 surface-contacts an inner surface of a light emission structure 16 in the light emission device 110 of the second exemplary embodiment. The light emission device 110 of the second exemplary embodiment can be manufactured by etching before forming the insulation layer 28 and the second electrode 20 is formed in the light emission structure 16 after forming the insulation layer 28 in the manufacturing method of the light emission device 100 (shown in FIG. 1) of the first exemplary embodiment. In this case, the nano structure to be eliminated by etching may be formed in the shape of a tube or a bar.

In the light emission device 110 of the second exemplary embodiment, electrons are transferred through the light emission structure 16 extended along the z-axis direction, current injection can be further effectively performed compared to the case that the electrons are transferred through the nano structure. Accordingly, light emission efficiency and output efficiency of the light emission device 110 can be further enhanced.

Figure 12:
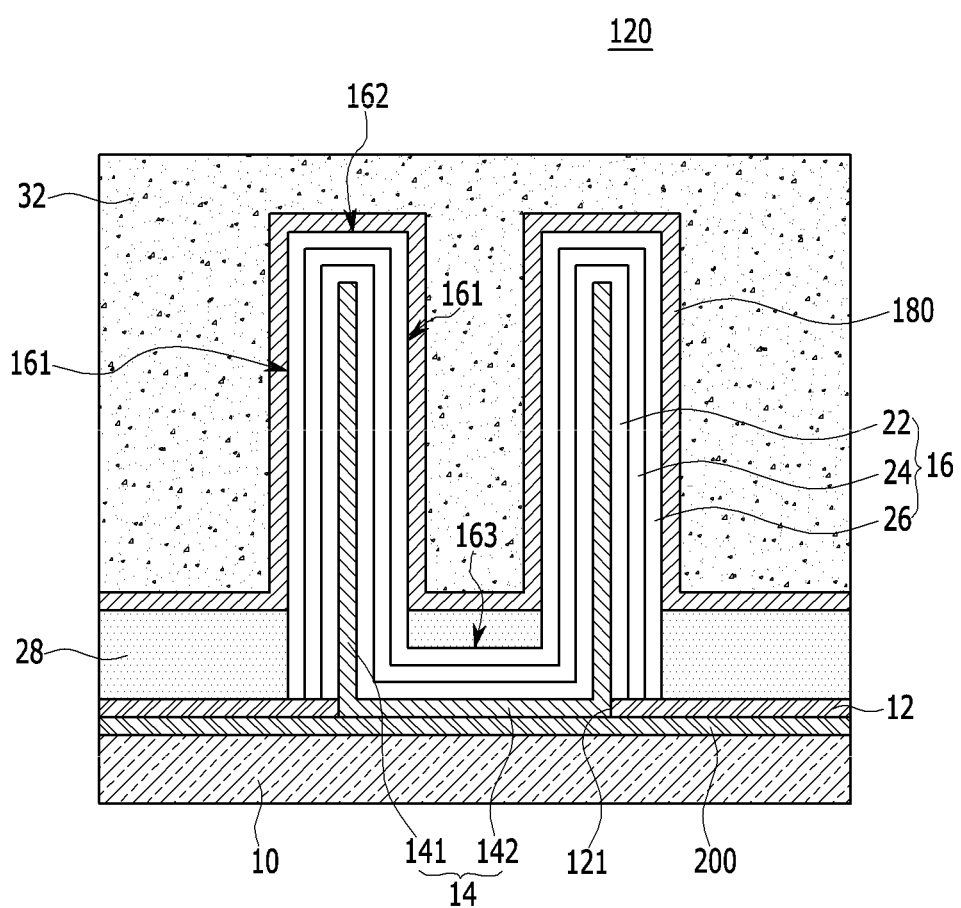
FIG. 12 is a schematic cross-sectional view of a light emission device according to a third exemplary embodiment of the present invention.

FIG. 12 is a schematic cross-sectional view of a light emission device 120 according to a third exemplary embodiment of the present invention. Sine a structure of the light emission device 120 of FIG. 12 is similar to the light emission device 100 (shown in FIG. 1), like reference numerals designate like elements and a detailed description thereof will be omitted.

Referring to FIG. 12, the light emission device 120 includes a substrate 10, a second electrode 200, a mask layer 12, a nano structure 14, a light emission structure 160, and a first electrode 180.

The second electrode 200 is disposed between the substrate 10 and the mask layer 12 and between the substrate 10 and an opening 121, and exposed to the outside through the opening 121 of the mask layer 12. The nano structure 14 is formed on the second electrode 200, penetrating the opening 121. The nano structure 14 includes a bottom portion surface-contacting the second electrode 200 and a wall portion 141 formed along an edge of the bottom portion 142 and extended along the z-axis direction.

The second electrode 200 may be a conductive seed layer. The conductive seed layer may be formed as a heavily-doped n-type semiconductor layer. For example, the conductive seed layer may be formed of gallium nitride highly doped with an n-type impurity. The second electrode 200 may include a metal layer (not shown) disposed between the conductive seed layer and the mask layer 12. The metal layer has an opening that is the same as that of the mask layer 12, and functions to increase electric conductivity of the second electrode 200.

The light emission structure 160 includes a first light emission portion 161 contacting internal and external surfaces of the wall portion 141 and extended along a direction that is the same as the wall portion 141, a second light emission portion 162 contacting the upper surface of the wall portion 141, and a third light emission portion 163 contacting the upper surface of the bottom portion 142. The light emission structure 160 includes an n-type semiconductor layer 22 and a p-type semiconductor layer 26, and a quantum active layer 24 may be disposed between the n-type semiconductor layer 22 and the p-type semiconductor layer 26. Since the light emission structure 160 contacts the internal and external surfaces of the wall portion 141, the upper surface of the wall portion 141, and the upper surface of the bottom portion 142, the surface area and the light emission area of the light emission structure 160 can be maximized. Accordingly, light emission efficiency and output efficiency of the light emission device 120 can be enhanced.

The insulation layer 28 is formed on the mask layer 12, and may be formed on the upper surface of the third light emission portion 163 with a constant thickness. In this case, the thickness of the insulation layer 28 should be smaller than the height of the wall portion 141.

The first electrode 180 is formed on the insulation layer 28 while surface-contacting the external surface of the first light emission portion 161 and the external surface of the second light emission portion 162. Since the first electrode 180 is formed in the external surfaces of the first and second light emission portions 161 and 162 along their shapes, the contact area of the light emission structure 160 and the first electrode 180 is increased so that contact resistance can be minimized.

The first electrode 180 may be covered by a conductive layer 32. The conductive layer 32 is formed to wholly cover the first electrode 180 while filling the inside of the first light emission portion 161. The conductive layer 32 may be formed of metal, transparent conductive oxide (TCO), conductive polymer, and a mixture thereof. The conductive layer 32 forms a wiring structure of the first electrode 180 by being electrically connected with the first electrode 180 and simultaneously functions as a heat sink increasing the efficiency of heat dissipation.

Figure 13:
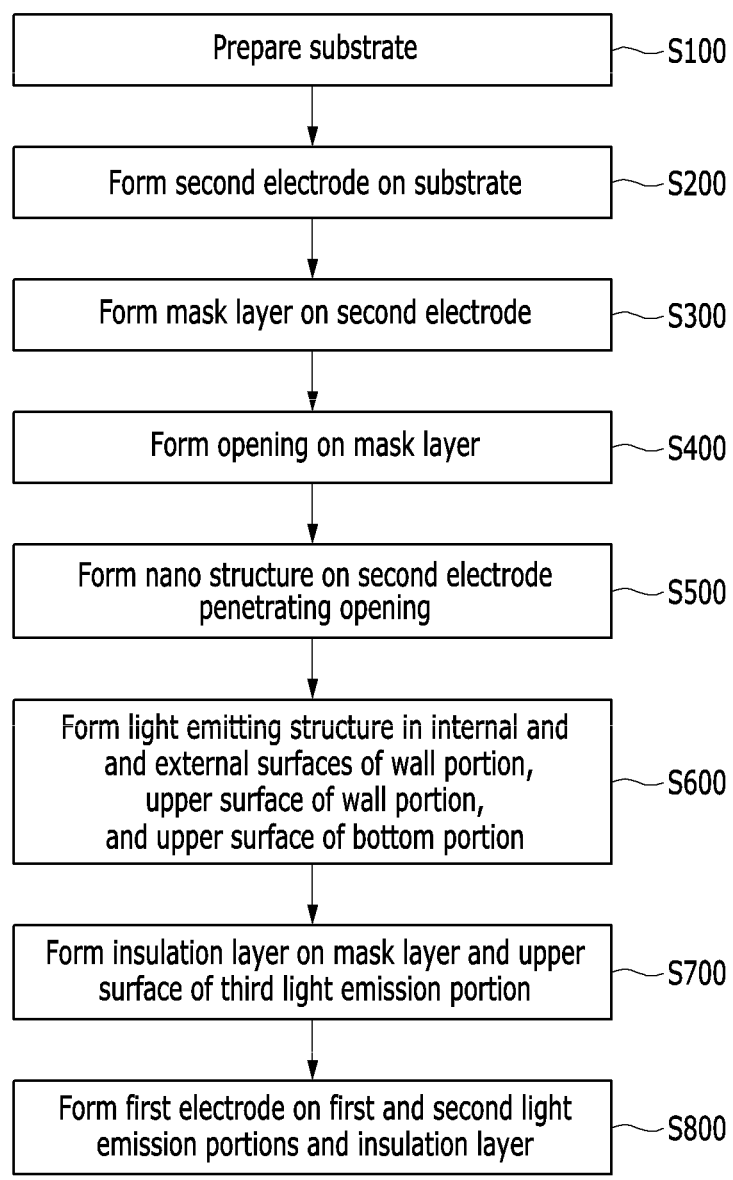
FIG. 13 is a schematic flowchart of a manufacturing method of the light emission device of FIG. 12.

FIG. 13 is a schematic flowchart of a manufacturing method of the light emission device shown in FIG. 12. FIG. 14 to FIG. 18 are schematic cross-sectional views of the manufacturing method of FIG. 13 on a step basis. Hereinafter, each step of FIG. 13 will be described with reference to FIG. 14 to FIG. 18.

Figure 14:
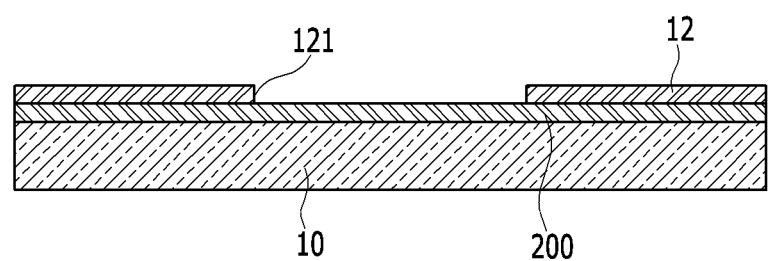
FIG. 14 to FIG. 18 are schematic cross-sectional views of the manufacturing method of FIG. 13 on a step basis.

In FIG. 3, the substrate 10 is prepared in the step of S100 and the second electrode 200 is formed on the substrate 10 in the step of S200. In the step of S300, the mask layer 12 is formed on the second electrode 200 and the opening 121 is formed in the mask layer 12 in the step of S400. Referring to FIG. 14, the second electrode 200 is exposed to the outside through the opening 121 of the mask layer 12. The second electrode 200 may be formed of gallium nitride highly doped with the n-type impurity.

Figure 15:
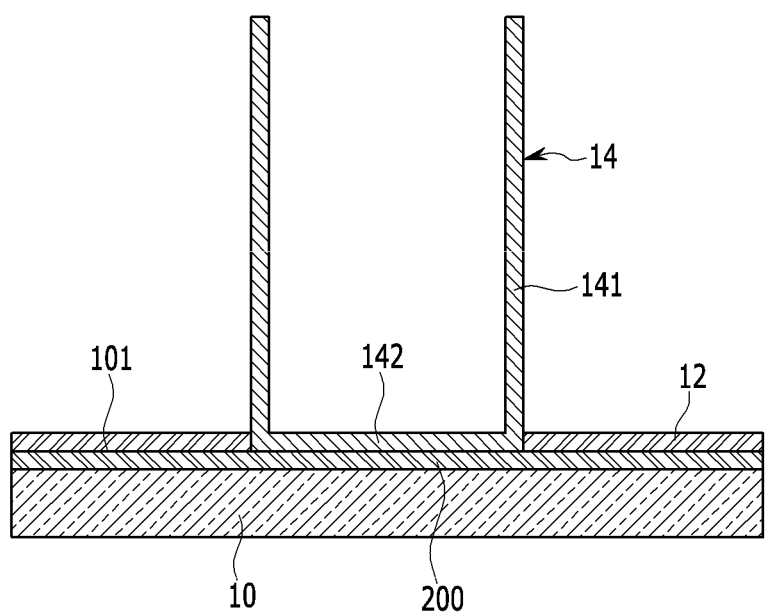

In the step of S500 in FIG. 13, the nano structure 14 including the bottom portion 142 and the wall portion 141 is formed on the second electrode 200. Here, the nano structure 14 penetrates the opening 121. Referring to FIG. 15, the bottom portion 142 of the nano structure 14 surface-contacts the second electrode 200, and the wall portion 141 is extended along a direction that is substantially perpendicular to the surface 101 of the substrate 10 from an edge of the bottom portion 142.

Figure 16:
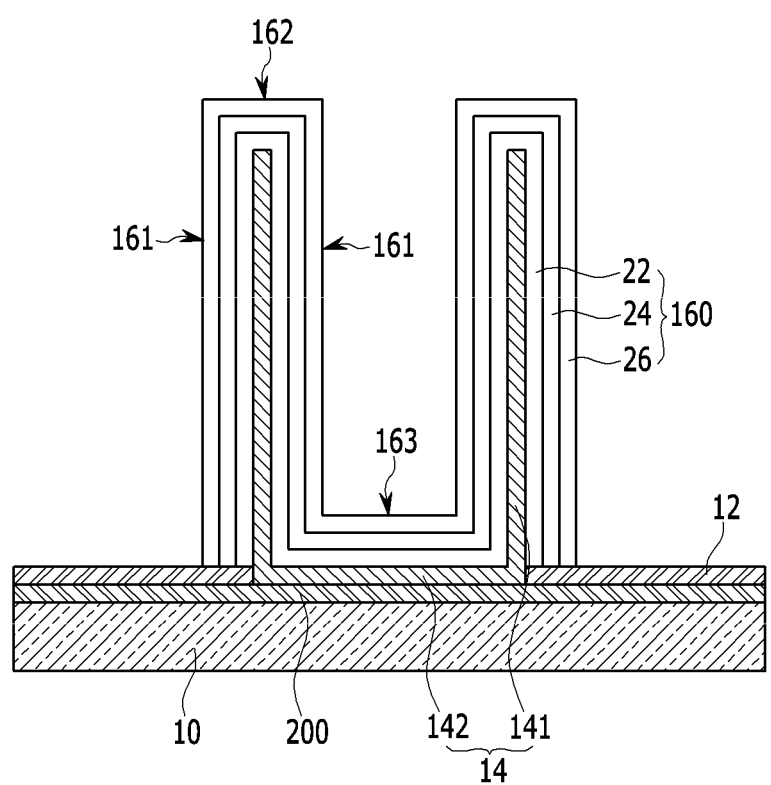

In the step S600 of FIG. 13, the light emission structure 160 is formed in the internal and external surfaces of the wall portion 141, the upper surface of the wall portion 141, and the upper portion of the bottom portion 142. Referring to FIG. 16, the light emission structure 160 is formed by sequentially growing the n-type semiconductor layer 22, the quantum active layer 24, and the p-type semiconductor layer 26 on the internal and external surfaces of the wall portion 141, the upper portion of the wall portion 141, and the upper portion of the bottom portion 142. The light emission structure 160 includes the first light emission portion 161 extended in the same direction of the wall portion 141 while contacting the internal and external surfaces of the wall portion 141, the second light emission portion 162 contacting the upper surface of the wall portion 141, and the third light emission portion 163 contacting the upper surface of the bottom portion 142.

Figure 17:
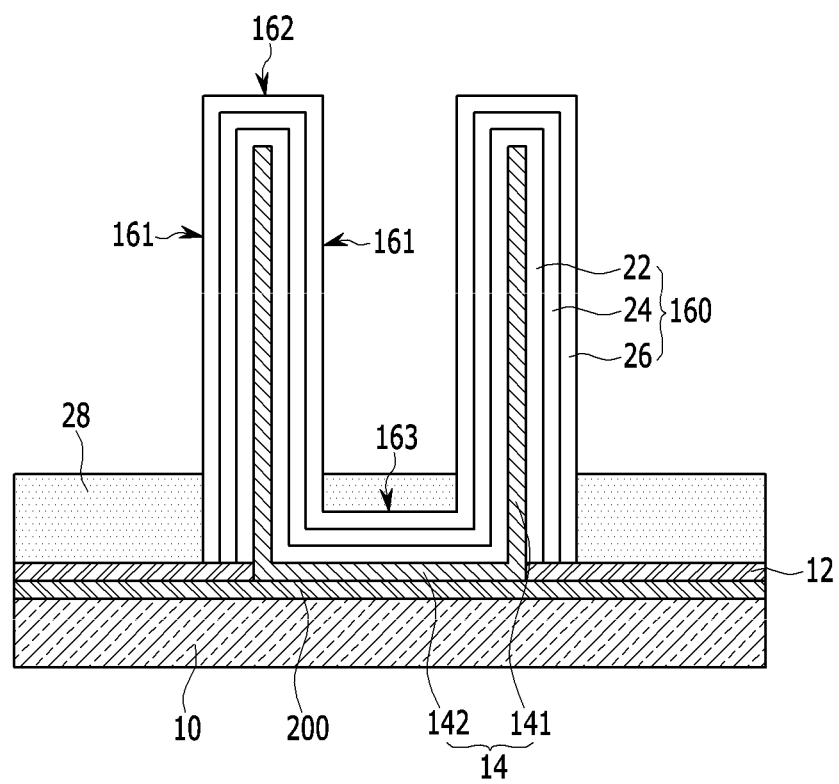

In the step S700 of FIG. 14, the insulation layer 28 is formed on the mask layer 12 and the upper surface of the third light emission portion 163. Referring to FIG. 17, the thickness of the insulation layer 28 is smaller than the height of the wall portion 141. Thus, after the insulation layer 28 is formed, the first light emission portion 161 and the second light emission portion 162 of the light emission structure 16 are exposed to the outside.

Figure 18:
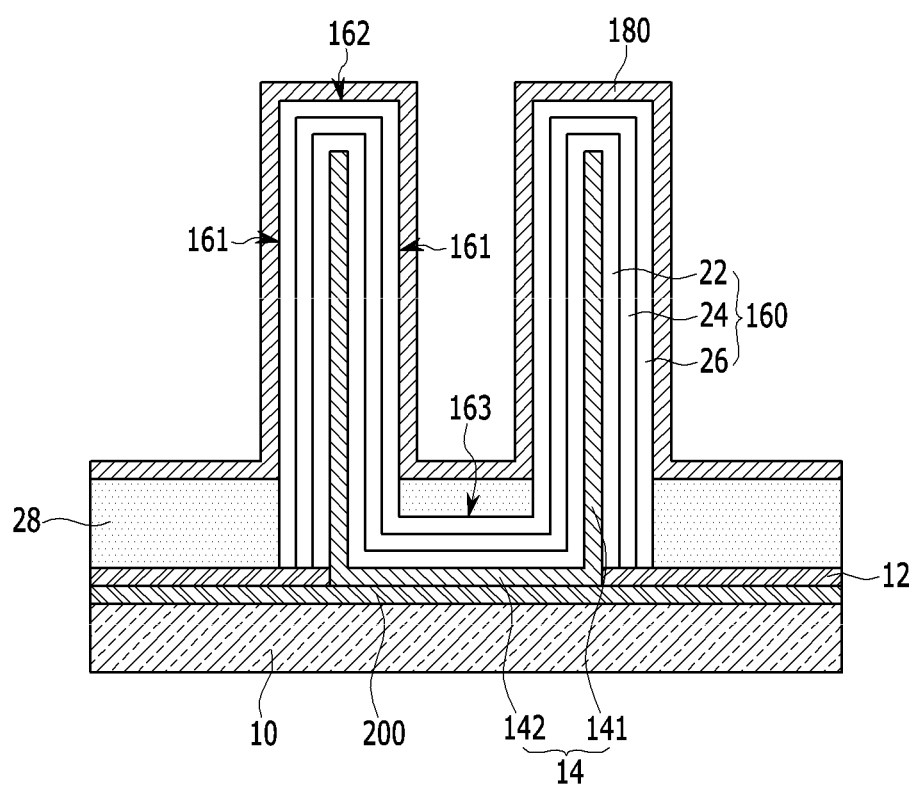

In the step S800 of FIG. 14, the first electrode 180 is formed on the first light emission portion 161, the second light emission portion 162, and the insulation layer 28. Referring to FIG. 18, the first electrode 180 is formed by depositing a first electrode material on the first light emission portion 161, the second light emission portion 162, and the insulation layer 28. The first electrode 180 may be formed by layering nickel and gold. Finally, the conductive layer 32 (refer to FIG. 12) is formed by depositing the conductive material and spin-coating or screen-printing the deposited conductive material to cover the first electrode 180 such that manufacturing o the light emission device 120 is completed.

In the above-described light emission devices 100, 110, and 120, the wall portion 141 of the nano structure 14 and the light emission structure 16 and 160 may be formed in shape of a tube in various shapes such as a circle, a triangle, a quadrangle, or a polygon. Alternatively, the wall portion 141 of the nano structure 14 of the light emission structures 16, 160 may be formed as a pair of wall portions formed opposing one another, or may be formed in the shape of a tube having one open end. The shapes of the wall portion 141 of the nano structure 14 and the light emission structures 16 and 160 may be variously controlled by changing the shape of the opening 121 of the mask layer 12.

Figure 19:
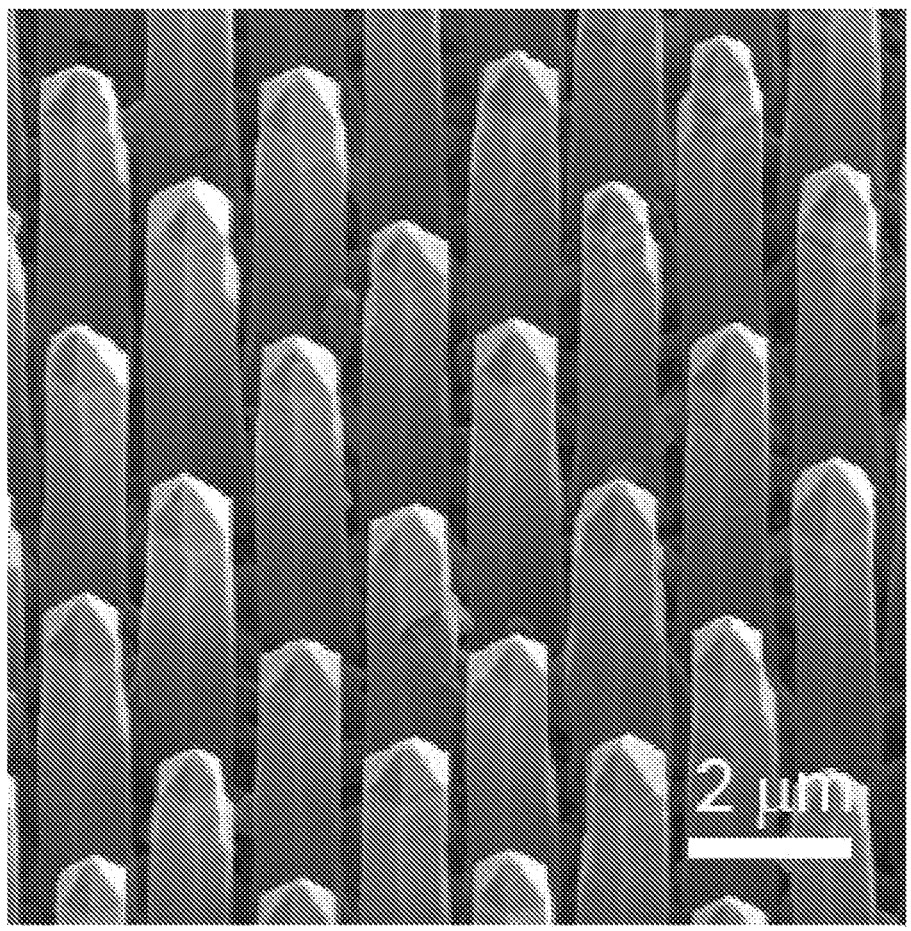
FIG. 19 is a stereoscopic SEM photo of the light emission structure formed on a second electrode in the light emission device of the third exemplary embodiment.

FIG. 19 is a stereoscopic scanning electronic microscope (SEM) photo of the light emission structure formed on the second electrode in the light emission device of the third exemplary embodiment. Referring to FIG. 19, it can be observed that the light emission structure formed in the shape of a hexagonal column is formed on the second electrode.

Figure 20:
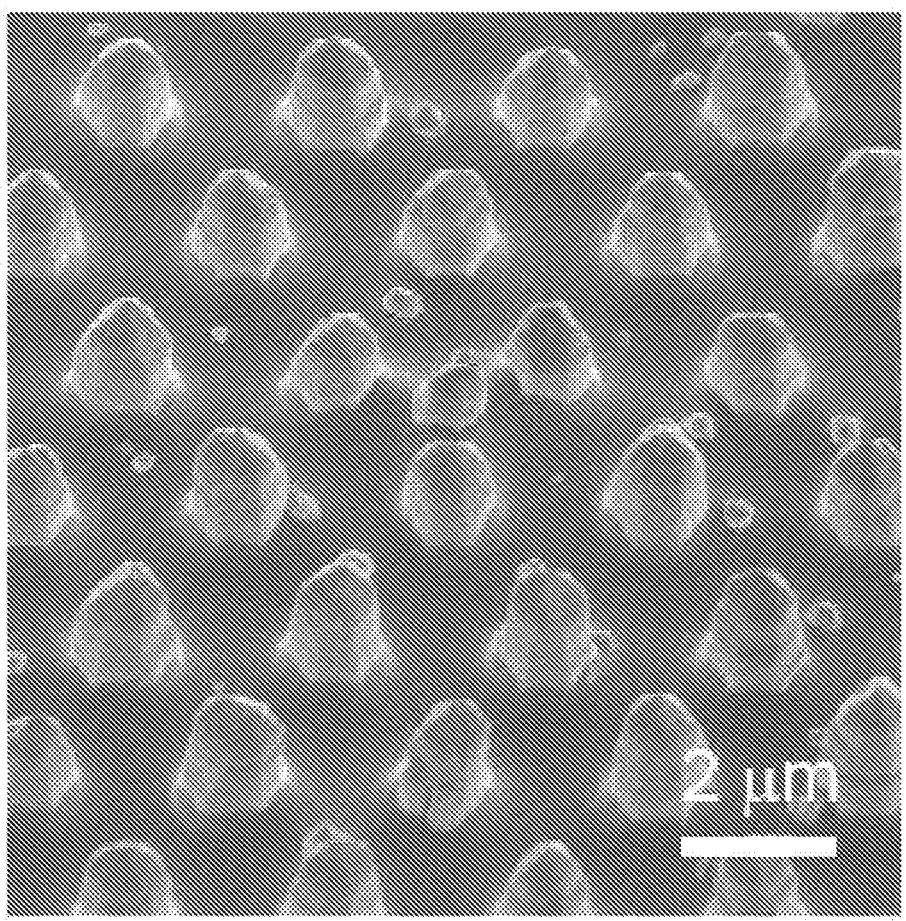
FIG. 20 is a stereoscopic SEM photo of a first electrode formed on an insulation layer and a light emission structure in the light emission device of the third exemplary embodiment.

FIG. 20 is a stereoscopic SEM photo of the first electrode formed in the insulation layer and the light emission structure in the light emission device of the third exemplary embodiment. Referring to FIG. 20, it can be observed that the first electrode covers the upper surface of the insulation layer and the upper portion of the light emission structure.

Figure 21:
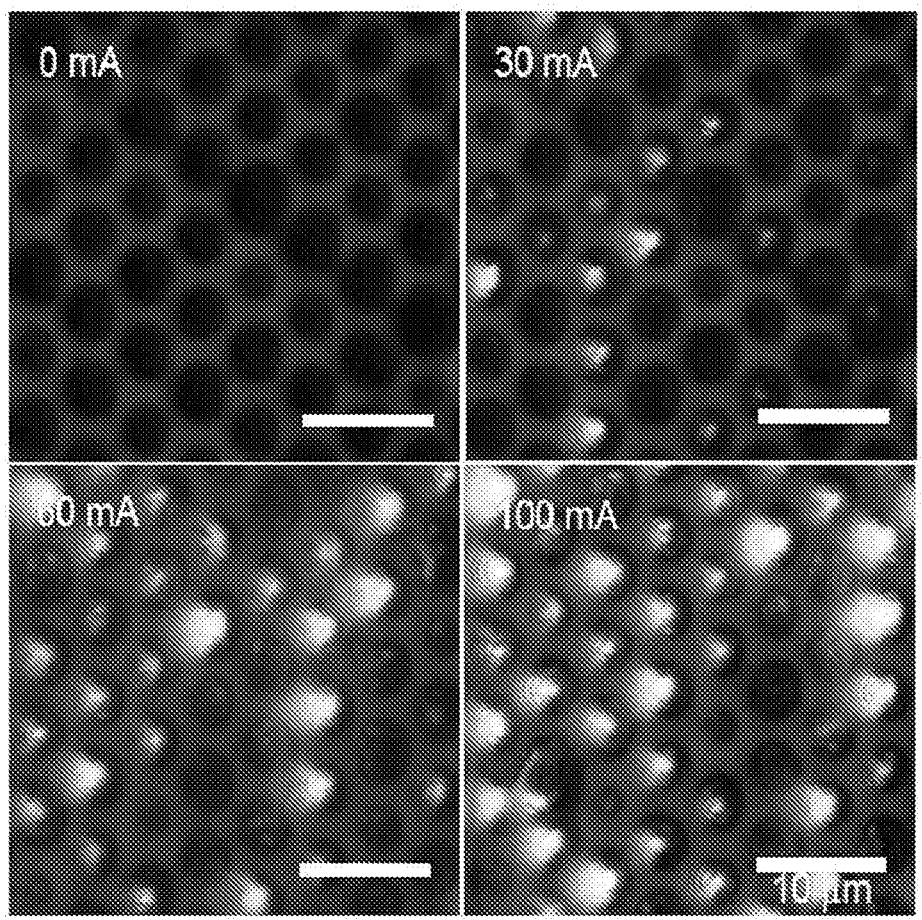
FIG. 21 is an electron micrograph of light emission characteristics of the light emission device with various current levels from 0 mA to 100 mA.

FIG. 21 is an electron SEM photo showing a luminance characteristic of the light emission device with various current levels of 0 mA to 100 mA.

Referring to FIG. 21, light emission does not occur when an input current is 0 mA. In addition, it can be observed that a luminance degree from the light emission structure is gradually increased as the input current is increase from 30 mA, 60 mA, to 100 mA and then light is emitted from most of the light emission structures with a high current level of 100 mA. The light is mostly green light and partially blue light is emitted. The light emitted from the light emission structure can be clearly observed with the naked eyes in an indoor lighting environment.

Figure 22:
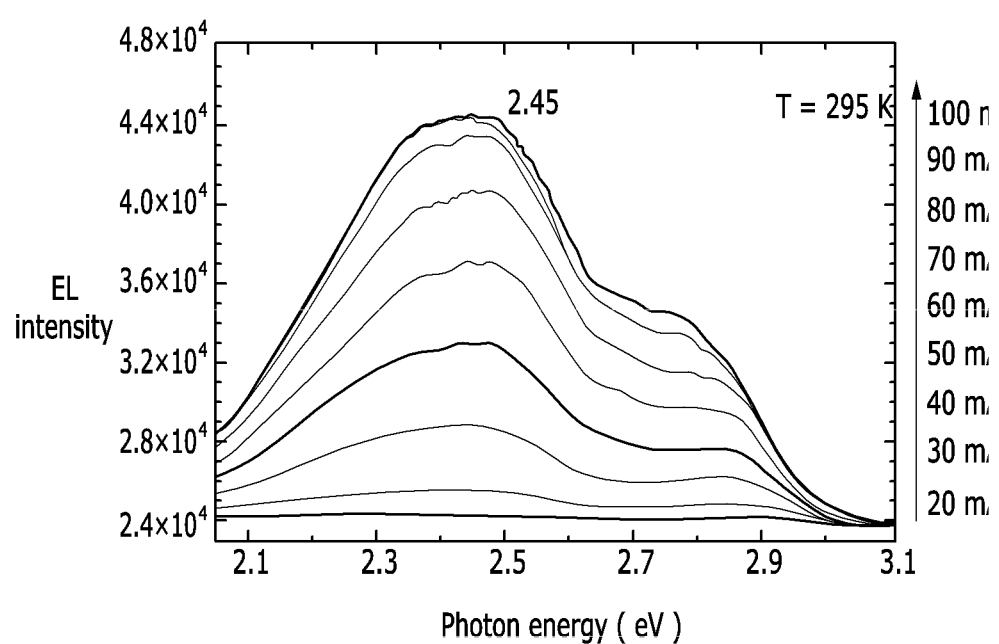
FIG. 22 is a graph showing results of measurement of an electroluminescence (EL) spectrum of the light emission device with various current levels of 20 mA to 100 mA.

FIG. 22 is a graph showing results of measurement of electroluminescence (EL) of the light emission device with various current levels of 20 mA to 100 mA.

Referring to FIG. 22, no visible light emission peak is observed in the applied current level of 20 mA, but the EL spectrum in the applied current level of over 30 mA has a first LE peak 2.45 eV and a second EL peak of 2.85 eV. As the applied current is increased, the first EL peak and the second EL peak are gradually increased while maintaining an almost equivalent increase ratio.

Figure 23:
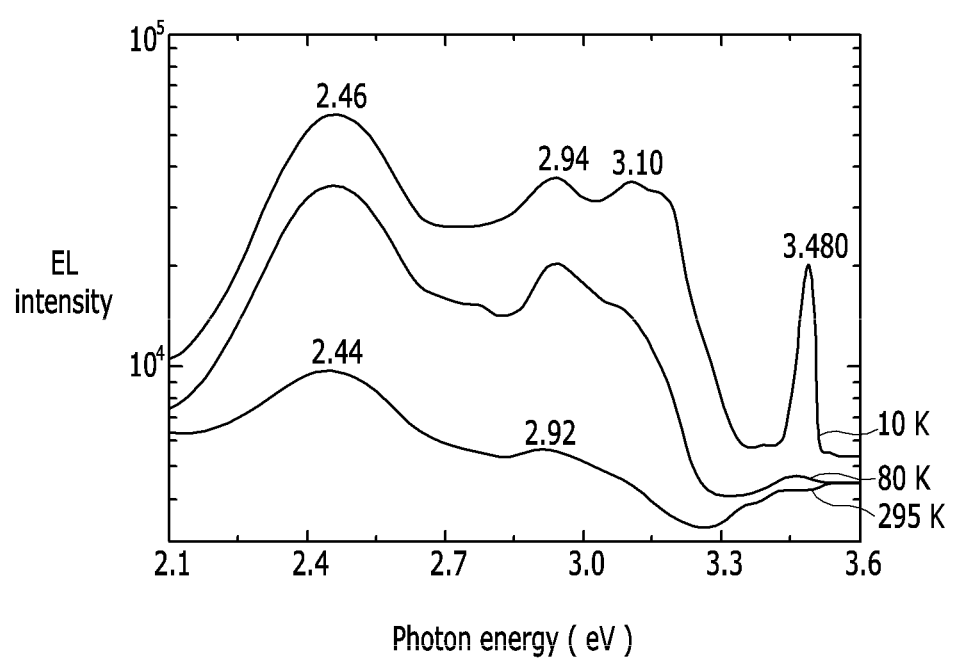
FIG. 23 is a graph showing results of measurement of photoluminescence (PL) of the light emission device with various temperatures of 10K, 80K, and 295K.

FIG. 23 is a graph showing results of measurement of photoluminescence (PL) of the light emission device with various temperatures of 10K, 80K, and 295K.

Referring to FIG. 23, room temperature PL peaks of 2.44 eV and 2.92 eV almost match the first EL peak of 2.45 eV and the second EL peak of 2.85 eV of FIG. 23. Meanwhile, PL peaks of 3.10 eV and 3.48 eV observed in the PL spectrum of 10K are resulted from light emission due to a magnesium dopant used as a p-type impurity and exciton from gallium nirtide. The intensity of the two PL peaks are significantly decreased at room temperature. Further, PL peaks of 2.46 eV and 2.94 eV are caused by light emission of the quantum active layer, and intensity of the two PL peaks are more slowly decreased in room temperature compared to PL peaks of 3.10 eV and 3.48 eV.

Figure 24:
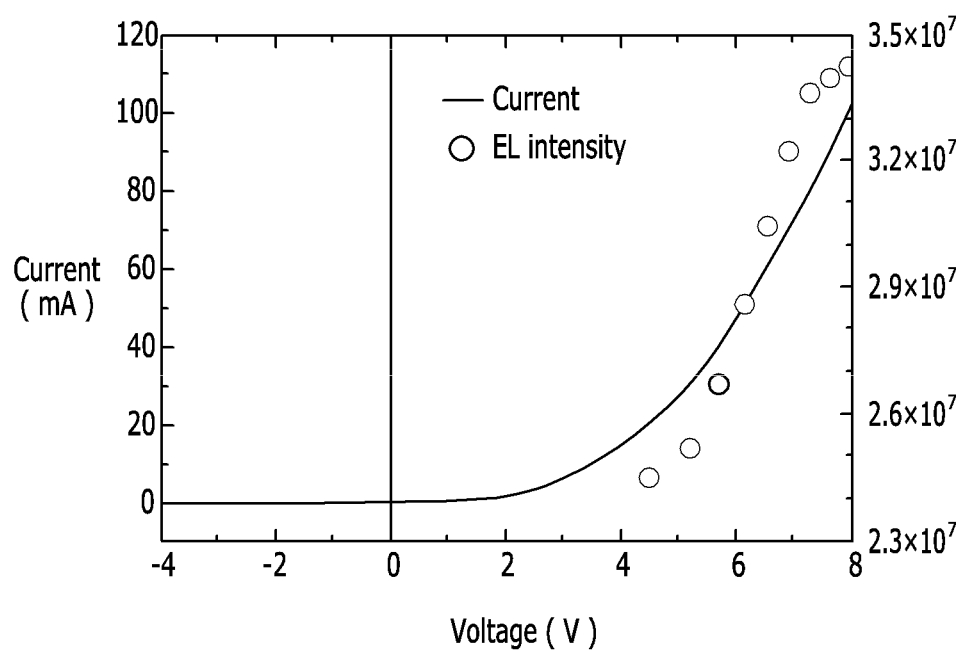
FIG. 24 is a graph showing results of measurement of a voltage-current curved line characteristic of the light emission device.

FIG. 24 is a graph showing results of measurement of a voltage-current curved line characteristic of the light emission device.

Referring to FIG. 24, a current-voltage (I-V) curved line represents a rectification characteristic at about 3V turn-on voltage and a leakage current of about $5 \times 10^{-4}$ A at −4V. In a range above 3V turn-on voltage, the current rapidly increases in proportional to the voltage so that intensity of light emission is increased. However, intensity of light emission is started to converged when the current exceeds 100 mA.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light emission device comprising:
   a substrate;
   a tube-shaped light emission structure provided on the substrate and extended substantially perpendicular to a surface of the substrate;
   a first electrode provided on the substrate while surface-contacting the external surface of the light emission structure;
   a second electrode disposed in the light emission structure and surface-contacting the internal surface of the light emission structure; and
   an insulation layer filled in the light emission structure, and wherein the second electrode, which is located on the insulation layer, further fills the inside of the light emission structure.

2. The light emission device of claim 1, wherein the light emission structure comprises an n-type semiconductor layer and a p-type semiconductor layer contacting the n-type semiconductor.

3. The light emission device of claim 2, wherein the light emission structure further comprises a quantum active layer disposed between the n-type semiconductor layer and the p-type semiconductor layer, and the quantum active layer comprises a plurality of quantum barrier layers and a plurality of quantum well layers layered between the plurality of quantum barrier layers.

4. The light emission device of claim 1, further comprising another insulation layer covering the light emission structure and the upper surface of the first electrode while surrounding the external surface of the first electrode, wherein a part of the second electrode is extended over the insulation layer.

5. The light emission device of claim 1, further comprising a mask layer disposed on the substrate while contacting the substrate and having at least one opening,
   wherein the light emission structure is formed on the mask layer surrounding the opening.

6. The light emission device of claim 5, further comprising seed layers disposed between the substrate and the mask layer and between the substrate and the opening.

7. A light emission device comprising:
   a substrate;
   a nano structure formed on the substrate and having a tube-shaped wall portion extended substantially perpendicular to a surface of the substrate;
   a light emission structure extended in a direction along the same direction in which the wall portion is extended while contacting the external surface of the wall portion;
   a first electrode provided on the substrate while surface-contacting the external surface of the light emission structure;
   a second electrode provided on the substrate so as to surface-contact the nano structure; and
   an insulation layer filled in the wall portion, and wherein the second electrode, which is located on the insulation layer, further fills the inside of the wall portion.

8. The light emission device of claim 7, wherein the second electrode is disposed in the wall portion and thus surface-contacts the internal surface of the wall portion.

9. The light emission device of claim 8, further comprising another insulation layer covering the external surface of the first electrode, the upper surface of the light emission structure, and the upper surface of the first electrode, wherein a part of the second electrode is extended over the insulation layer.

10. The light emission device of claim 7, further comprising a mask layer disposed on the substrate while contacting the substrate and having at least one opening,
wherein the nano structure is formed on the substrate while penetrating the opening.

11. The light emission device of claim 10, further comprising seed layers disposed between the substrate and the mask layer and between the substrate and the opening.

12. The light emission device of claim 10, wherein the nano structure further comprises a bottom portion contacting the wall portion, and the second electrode surface-contacts the bottom portion by being disposed between the substrate and the mask layer and between the substrate and the bottom portion.

13. The light emission device of claim 12, wherein the second electrode is formed of a conductive seed layer.

14. The light emission device of claim 13, wherein the second electrode further comprises a metal layer disposed between the conductive seed layer and the mask layer.

15. The light emission device of claim 12, wherein the light emission structure comprises:

a first light emission portion extended along the same direction along which the wall portion is extended while contacting the internal and external surfaces of the wall portion;
a second light emission portion contacting the upper surface of the wall portion; and
a third light emission portion contacting the upper surface of the bottom portion.

16. The light emission device of claim 15, further comprising an insulation layer formed between the mask layer and the first electrode and the upper surface of the third light emission portion,
wherein the thickness of the insulation layer is smaller than the height of the wall portion.

17. The light emission device of claim 16, wherein the first electrode is formed on the insulation layer while contacting the external surface of the first light emission portion and the external surface of the second light emission portion.

18. The light emission device of claim 17, further comprising a conductive layer covering the first electrode while filling the inside of the first light emission portion.

\* \* \* \* \*